United States Patent
Katsunuma

(10) Patent No.: US 12,334,331 B2
(45) Date of Patent: Jun. 17, 2025

(54) SUBSTRATE PROCESSING METHOD AND PLASMA PROCESSING APPARATUS

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 229 days.

(21) Appl. No.: 17/458,996

(22) Filed: Aug. 27, 2021

(65) Prior Publication Data

US 2022/0068629 A1 Mar. 3, 2022

(30) Foreign Application Priority Data

Aug. 28, 2020 (JP) ................. 2020-144390
Jan. 19, 2021 (JP) ................. 2021-006624

(51) Int. Cl.
*H01L 21/02* (2006.01)
*H01J 37/32* (2006.01)
*H01L 21/3065* (2006.01)
*H01L 21/311* (2006.01)

(52) U.S. Cl.
CPC .... *H01L 21/0212* (2013.01); *H01J 37/32449* (2013.01); *H01L 21/3065* (2013.01); *H01L 21/31116* (2013.01); *H01J 2237/332* (2013.01); *H01J 2237/334* (2013.01)

(58) Field of Classification Search
CPC ............ H01L 21/0212; H01L 21/3065; H01L 21/31116; H01L 21/30655; H01L 21/32137; H01J 37/32449; C23C 16/401; C23C 16/52
See application file for complete search history.

(56) References Cited

U.S. PATENT DOCUMENTS

| | | | |
|---|---|---|---|
| 5,010,378 A * | 4/1991 | Douglas | H01L 21/3085 257/519 |
| 6,846,745 B1 * | 1/2005 | Papasouliotis | H01L 21/02164 257/E21.546 |
| 9,209,012 B2 * | 12/2015 | Chen | H01L 21/31116 |
| 9,960,033 B1 * | 5/2018 | Nozawa | H01L 21/02274 |
| 2009/0159560 A1 * | 6/2009 | Kiehlbauch | H01L 21/31116 216/17 |
| 2016/0343580 A1 | 11/2016 | Hudson | |
| 2016/0379834 A1 * | 12/2016 | Katsunuma | H01J 37/32642 438/720 |
| 2017/0178920 A1 * | 6/2017 | Dole | H01J 37/32137 |
| 2018/0174858 A1 | 6/2018 | Hudson | |

(Continued)

FOREIGN PATENT DOCUMENTS

JP 2019-207911 A 12/2019

*Primary Examiner* — Yara B Green
*Assistant Examiner* — Fakeha Sehar
(74) *Attorney, Agent, or Firm* — XSENSUS LLP

(57) ABSTRACT

A substrate processing method includes step (a) of adsorbing a precursor on a side wall surface of a substrate where the side wall surface defines a recess in the substrate. The substrate processing method further includes step (b) of supplying a first chemical species and a second chemical species to the substrate. The first chemical species forms a film from the precursor on the side wall surface, and the second chemical species suppresses an increase of the thickness of the film. Steps (a) and (b) are alternately repeated.

17 Claims, 13 Drawing Sheets

(56) References Cited

U.S. PATENT DOCUMENTS

| | | | | |
|---|---|---|---|---|
| 2019/0035605 A1* | 1/2019 | Suzuki | ............... | C23C 16/401 |
| 2020/0168463 A1* | 5/2020 | Ko | ................ | H01L 21/3081 |
| 2020/0373149 A1* | 11/2020 | Park | ............... | H01L 21/02274 |
| 2021/0104399 A1* | 4/2021 | Kuroda | ............ | H01L 21/02274 |
| 2022/0301853 A1* | 9/2022 | Liu | ................ | H01J 37/32449 |

* cited by examiner

SUBSTRATE PROCESSING METHOD AND PLASMA PROCESSING APPARATUS

CROSS-REFERENCE TO RELATED APPLICATION

This application is based on and claims priority from Japanese Patent Application Nos. 2020-144390 and 2021-006624, filed on Aug. 28, 2020 and Jan. 19, 2021, respectively, with the Japan Patent Office, the disclosure of which is incorporated herein in its entirety by reference.

TECHNICAL FIELD

The present disclosure relates to a substrate processing method and a plasma processing apparatus.

BACKGROUND

A plasma etching is used to form a recess in a substrate. In the plasma etching, it is required to suppress the recess from expanding in the lateral direction. Therefore, a technique of forming a film on the side wall surface that defines the recess is used. Such a technique is described in U.S. Patent Application Publication Nos. 2016/0343580 and 2018/0174858.

SUMMARY

In an embodiment, a substrate processing method is provided. The substrate processing method includes step (a) of adsorbing a precursor on a side wall surface of a substrate. The side wall surface defines a recess in the substrate. The substrate processing method further includes step (b) of supplying a first chemical species and a second chemical species to the substrate. The first chemical species forms a film from the precursor on the side wall surface, and the second chemical species suppresses an increase in the thickness of the film. Steps (a) and (b) are alternately repeated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
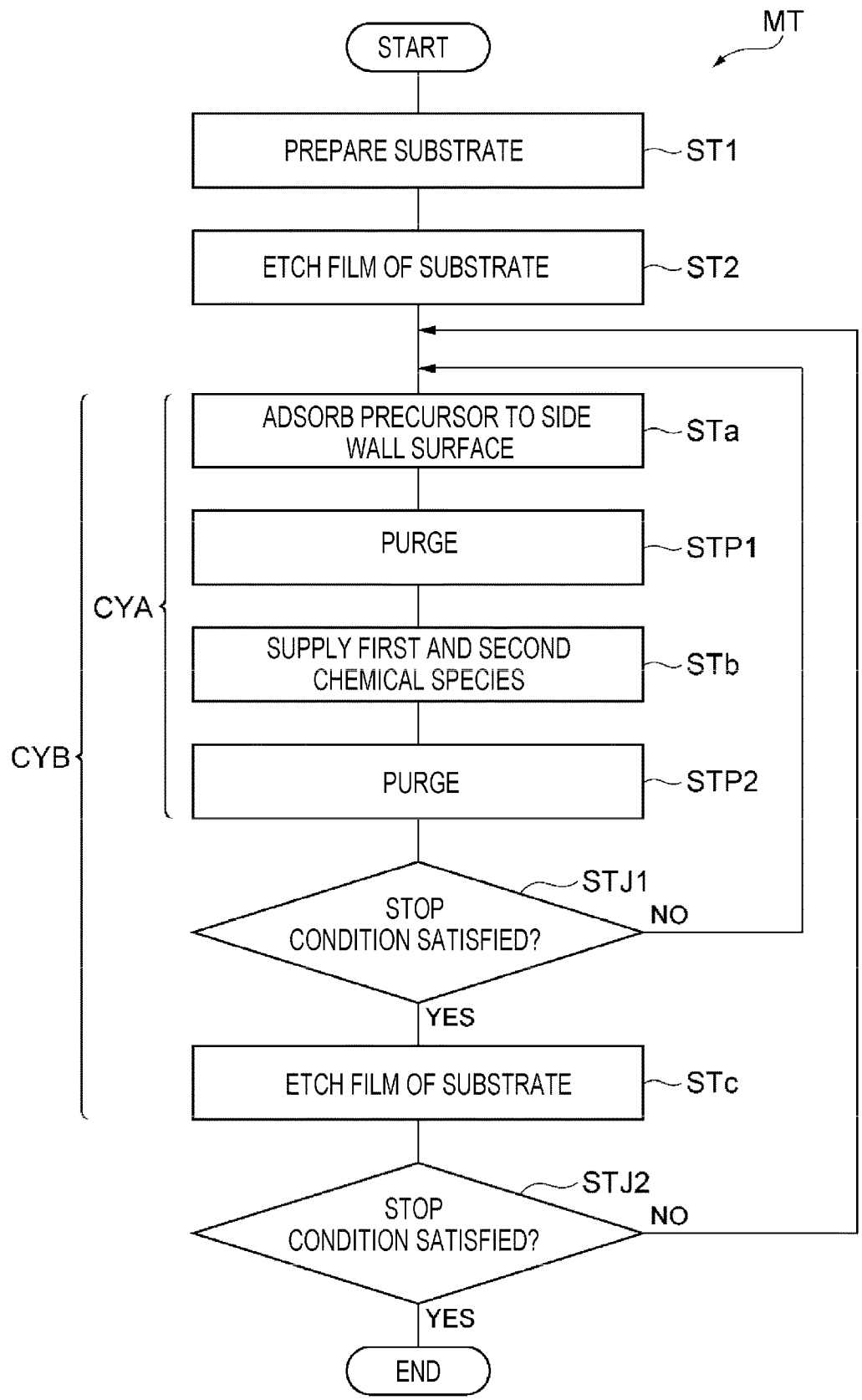
FIG. 1 is a flowchart of a plasma processing method according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, a substrate processing method is provided. The substrate processing method includes step (a) of adsorbing a precursor on a side wall surface of a substrate. The side wall surface defines a recess in the substrate. The substrate processing method further includes step (b) of supplying a first chemical species and a second chemical species to the substrate. The first chemical species forms a film from the precursor on the side wall surface, and the second chemical species suppresses an increase in the thickness of the film. Steps (a) and (b) are alternately repeated.

In the embodiment, a film is formed on the side wall surface by the reaction between the precursor and the first chemical species. The second chemical species suppresses the increase in film thickness, especially at the opening site of the recess. Therefore, according to the embodiment, the closure of the opening of the recess by the film formed on the substrate is suppressed.

In another embodiment, a second chemical species may be a halogen chemical species. The second chemical species may be a fluorine chemical species.

In still another embodiment, a second chemical species may be generated from at least one of fluorocarbon, hydrofluorocarbon, nitrogen trifluoride, or sulfur hexafluoride.

In yet another embodiment, a precursor may contain silicon.

In yet another embodiment, an electrical bias may be applied to the lower electrodes of a substrate support that supports a substrate in step (b). According to this embodiment, the position in the depth direction in the recess where the film is formed may be set by the magnitude of the electrical bias.

In yet another embodiment, the magnitude of the electrical bias may be varied in the alternating repetition of steps (a) and (b). According to this embodiment, it is possible to change the position in the depth direction in the recess in which the film is formed by alternately repeating steps (a) and (b).

In yet another embodiment, the substrate processing method may further include step (c) of etching the substrate to increase the depth of the recess after alternating repetition of steps (a) and (b).

In yet another embodiment, first and second cycles, each including alternating steps (a) and (b) and step (c), may be performed in sequence. The magnitude of the electrical bias applied to the lower electrode of the substrate support that supports the substrate in step (b) within the first cycle may be different from the magnitude of the electrical bias applied to the lower electrode in step (b) within the second cycle.

In yet another embodiment, the magnitude of the electrical bias used in step (b) within the second cycle may be greater than the magnitude of electrical bias used in step (b) within the first cycle. According to this embodiment, it is possible to form a film at a deeper part in the recess depending on the depth of the recess.

In yet another embodiment, a plasma processing apparatus is provided. The plasma processing apparatus includes a chamber, a gas supply, a plasma generator, and a controller. The gas supply is configured to supply a precursor gas, a first gas, and a second gas into the chamber. The plasma generator is configured to generate a plasma from the first gas and the second gas. The controller (a) controls the gas supply to supply the precursor gas into the chamber. By the control (a), the precursor contained in the precursor gas is adsorbed on the side wall surface of the substrate. The controller (b) controls the gas supply and the plasma generator to generate a plasma from the first gas and the second gas in the chamber. By the control (b), the first chemical species that forms a film from the precursor on the side wall surface is generated from the first gas, and the second chemical species that suppresses the increase in the thickness of the film is generated from the second gas. The controller is configured to alternately repeat the control (a) and the control (b).

Hereinafter, various embodiments will be described in detail with reference to the accompanying drawings. Further, in the respective drawings, the same or corresponding parts will be denoted by the same symbols.

FIG. 1 is a flowchart of a plasma processing method according to an embodiment. The substrate processing method illustrated in FIG. 1 (hereinafter, referred to as a "method MT") is performed to form a film on the side wall surface that defines the recess in the substrate. The method MT may further include etching the substrate after film formation.

Figure 2:
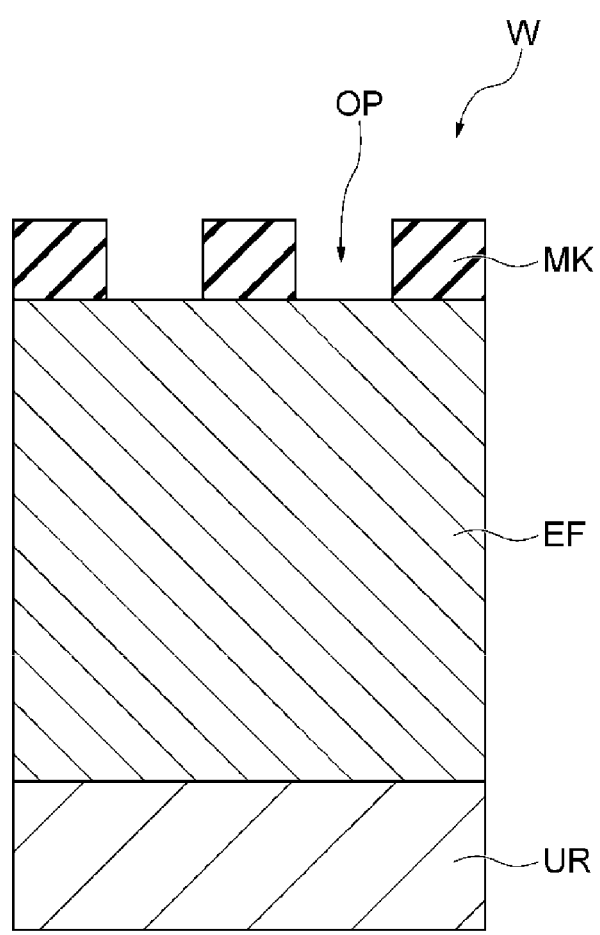
FIG. 2 is a partially enlarged cross-sectional view illustrating an example of a substrate.

FIG. 2 is a partially enlarged cross-sectional view illustrating an example of a substrate. The method MT is applicable to the substrate W illustrated in FIG. 2. The substrate W has a film EF and a mask MK. The substrate W may further have an underlying region UR. The film EF may be formed on the underlying region UR.

The film EF is an etching film and is etched in the method MT. The film EF is, for example, a silicon-containing film. The silicon-containing film may be a monolayer film or a multilayer film. The monolayer film is, for example, a silicon oxide film, a silicon nitride film, a polycrystalline silicon film, or a silicon-containing low dielectric constant film. The multilayer film is formed of two or more of a silicon oxide film, a silicon nitride film, and a polycrystalline silicon film. The film EF may be formed from other materials.

The mask MK is formed on the film EF. The mask MK may be formed from any material as long as the film EF is selectively etched with respect to the mask MK. The mask MK is formed from, for example, an organic film such as a photoresist film, an amorphous carbon film, or a spin-on carbon film, a silicon-containing film, or a metal-containing film. The mask MK has a pattern that is transferred to the film EF. That is, the mask MK provides the recess OP.

Figure 3:
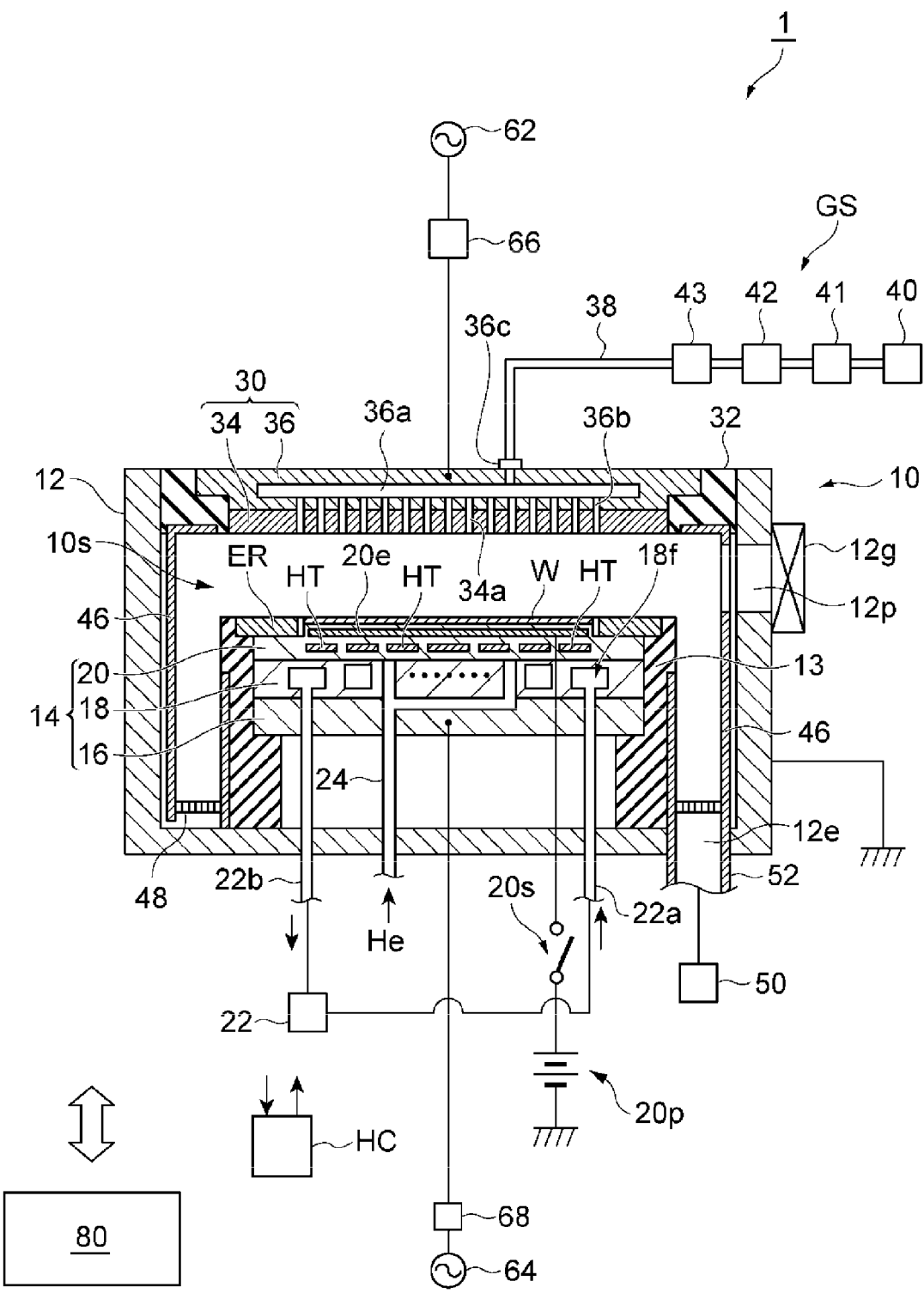
FIG. 3 is a view schematically illustrating a plasma processing apparatus according to the embodiment.

In yet another embodiment, the method MT is performed using a plasma processing apparatus. FIG. 3 is a view schematically illustrating the plasma processing apparatus according to the embodiment. The method MT2 may be executed using the plasma processing apparatus 1 illustrated in FIG. 3. The plasma processing apparatus 1 is a capacitively coupled plasma processing apparatus. The plasma processing apparatus 1 includes a chamber 10. The chamber 10 provides an internal space 10s therein.

In yet another embodiment, the chamber 10 may include a chamber body 12. The chamber body 12 has a substantially cylindrical shape. The internal space 10s is provided inside the chamber body 12. The chamber body 12 is formed of a material such as aluminum. The chamber body 12 is grounded. A film having corrosion resistance is formed on the inner wall surface of the chamber body 12. The film having corrosion resistance may be a film formed of a ceramic such as aluminum oxide or yttrium oxide.

A passage 12p is provided in the side wall of the chamber body 12. A substrate W passes through the passage 12p when being transferred between the internal space 10s and the outside of the chamber 10. The passage 12p may be opened and closed by a gate valve 12g. The gate valve 12g is provided along the side wall of the chamber body 12.

The plasma processing apparatus 1 further includes a substrate support 14. The substrate support 14 is configured to support the substrate W in the chamber 10, that is, in the internal space 10s. The substrate support 14 is provided in the chamber 10. The substrate support 14 may be supported by a support 13. The support 13 is formed of an insulating material. The chamber body 13 has a substantially cylindrical shape. The support 13 extends upward from the bottom of the chamber body 12 in the internal space 10s.

According to yet another embodiment, the substrate support 14 may include a lower electrode 18 and an electrostatic chuck 20. The substrate support 14 may further include an electrode plate 16. The electrode plate 16 is formed of a conductive material such as aluminum and has a substantially disk shape. The lower electrode 18 is provided on the electrode plate 16. The lower electrode plate 18 is formed of a conductive material such as aluminum and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body formed of a dielectric material. The main body of the electrostatic chuck 20 has a substantially disk shape. The electrostatic chuck 20 further includes an electrode 20e. The electrode 20e is provided in the main body of the electrostatic chuck 20. The electrode 20e is a film-shaped electrode. The electrode 20e is connected to a DC power supply 20p via a switch 20s. When a voltage from the DC power supply 20p is applied to the electrodes of the electrostatic chuck 20, an electrostatic attractive force is generated between the electrostatic chuck 20 and the substrate W. The substrate W is attracted to the electrostatic chuck 20 by the generated electrostatic attractive force and is held by the electrostatic chuck 20.

The substrate support 14 may support an edge ring ER arranged thereon. The edge ring ER may be formed from, but not limited to, silicon, silicon carbide, or quartz. When the substrate W is processed in the chamber 10, the substrate W is arranged on the electrostatic chuck 20 and in a region surrounded by the edge ring ER.

A flow path 18f is provided in the lower electrode 18. The flow path 18f receives a heat exchange medium (e.g., a coolant) supplied from a chiller unit 22 via a pipe 22a. The chiller unit 22 is provided outside the chamber 10. The heat exchange medium supplied to the flow path 18f is returned to the chiller unit 22 via a pipe 22b. In the plasma processing apparatus 1, the temperature of the substrate W placed on the electrostatic chuck 20 is adjusted by heat exchange between the heat exchange medium and the lower electrode 18.

The temperature of the substrate W may be adjusted by one or more heaters provided in the substrate support 14. In the example illustrated in FIG. 3, a plurality of heater HTs is provided in the electrostatic chuck 20. Each of the plurality of heaters HT may be a resistance heating element. The plurality of heaters HT are connected to a heater controller HC. The heater controller HC is configured to supply an adjusted amount of electric power to each of the plurality of heaters HT.

The plasma processing apparatus 1 may further include a gas supply line 24. The gas supply line 24 supplies a heat transfer gas (e.g., a He gas) to a gap between the upper surface of the electrostatic chuck 20 and the back surface of the substrate W. The heat transfer gas is supplied to the gas supply line 24 from a heat transfer gas supply mechanism.

The plasma processing apparatus 1 further includes an upper electrode 30. The upper electrode 30 is provided above the substrate support 14. The upper electrode 30 is supported on the upper portion of the chamber body 12 via a member 32. The member 32 is made of an insulating material. The upper electrode 30 and the member 32 close the upper opening of the chamber body 12.

The upper electrode 30 may include a top plate 34 and a support body 36. The lower surface of the top plate 34 is the lower surface of the internal space 10s, and defines the internal space 10s. The top plate 34 may be formed of a silicon-containing material. The top plate 34 is formed of, for example, silicon or silicon carbide. The top plate 34 provides a plurality of gas holes 34a. The plurality of gas holes 34a penetrate the top plate 34 in the plate thickness direction.

The support body 36 detachably supports the top plate 34. The support body 36 is formed of a conductive material such as aluminum. A gas diffusion chamber 36a is provided inside the support body 36. The support body 36 further provides a plurality of gas holes 36b. The plurality of gas holes 36b extend downward from the gas diffusion chamber 36a. The plurality of gas holes 36b communicate with the plurality of gas discharge holes 34a, respectively. The support body 36 further provides a gas inlet 36c. The gas inlet 36c is connected to the gas diffusion chamber 36a. A gas supply pipe 38 is connected to the gas inlet 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The gas sources of the gas source group 40 include the gas sources utilized in the method MT. Each of the valve group 41 and the valve group 43 includes a plurality of opening/closing valves. The flow rate controller group 42 includes a plurality of flow rate controllers. Each of the plurality of flow rate controllers in the flow rate controller group 42 is a mass flow controller or a pressure control type flow rate controller. Each of the plurality of gas sources in the gas source group 40 is connected to the gas supply pipe 38 via a corresponding opening/closing valve of the valve group 41, a corresponding flow rate controller of the flow rate controller group 42, and a corresponding opening/closing valve of the valve group 43.

The plasma processing apparatus 1 may further include a shield 46. The shield 46 is detachably provided along the inner wall surface of the chamber body 12. The shield 46 is provided in the outer periphery of the support 13 as well. The shield 46 suppresses the by-products of the plasma processing from adhering to the chamber body 12. The shield 46 is constituted by forming a film having corrosion resistance on the surface of a member made of, for example, aluminum. The film having corrosion resistance may be a film formed of a ceramic such as yttrium oxide.

The plasma processing apparatus 1 may further include a baffle member 48. The baffle member 48 is provided between the support 13 and the side wall of the chamber body 12. The baffle member 48 is formed by forming a corrosion-resistant film on the surface of a plate-shaped member formed of, for example, aluminum. The film having corrosion resistance may be a film formed of a ceramic such as yttrium oxide. The baffle member 48 has a plurality of through holes. An exhaust port 12e is provided below the baffle member 48 and at the bottom of the chamber body 12. An exhaust device 50 is connected to the exhaust port 12e via an exhaust pipe 52. The exhaust device 50 has a vacuum pump such as a pressure control valve or a turbo molecular pump.

The plasma processing apparatus 1 further includes a first radio-frequency power supply 62 and a bias power supply 64. The radio-frequency power supply 62 is configured to generate radio-frequency power (hereinafter, referred to as "radio-frequency power HF"). The radio-frequency power HF has a frequency suitable for generating plasma. The frequency of the radio-frequency power HF is, for example, 27 MHz or more and 100 MHz or less. The radio-frequency power supply 62 is connected to the upper electrode 30 via a matching device 66. The matching device 66 includes a circuit that matches the impedance on the load side (upper electrode 30 side) of the radio-frequency power supply 62 with the output impedance of the radio-frequency power supply 62. The radio-frequency power supply 62 may constitute a plasma generator in an embodiment. Further, the radio-frequency power supply 62 may be connected to the lower electrode 18 via the matching device 66.

The bias power supply 64 is configured to apply an electrical bias EB to the lower electrode 18. The electrical bias EB has a frequency suitable for drawing ions into the substrate W. The frequency of the electrical bias EB is, for example, 100 kHz or more and 40.68 MHz or less. When the electrical bias EB is used with the radio-frequency power HF, the electrical bias EB has a frequency lower than the frequency of the radio-frequency power HF.

In an embodiment, the electrical bias EB may be radio-frequency bias power (hereinafter, referred to as "radio-frequency power LF"). In this embodiment, the bias power supply 64 is connected to the lower electrode 18 via the matching device 68 and the electrode plate 16. The matching device 68 includes a circuit that matches the impedance on the load side (upper electrode 18 side) of the bias power supply 64 with the output impedance of the bias power supply 64. The plasma processing apparatus 1 may be configured to generate a plasma using only the radio-frequency power LF. In this case, the bias power supply 64 constitutes the plasma generator of the embodiment. In this case, the plasma processing apparatus 1 does not have to include the radio-frequency power supply 62 and the matching device 66.

In an embodiment, the electrical bias EB may be a pulse of negative DC voltage. In this embodiment, a pulse of negative DC voltage is periodically applied to the lower electrode 18.

The plasma processing apparatus 1 further includes a controller 80. The controller 80 may be a computer that includes a processor, a storage such as a memory, an input device, a display device, and a signal input/output interface. The controller 80 controls each part of the plasma processing apparatus 1. In the controller 80, an operator may use the input device to input a command in order to manage the plasma processing apparatus 1. Further, in the controller 80, the display device may visualize and display the operating status of the plasma processing apparatus 1. In addition, the storage of the controller 80 stores a control program and recipe data. The control program is executed by the processor of the controller 80 in order to execute various processes in the plasma processing apparatus 1. The processor of the controller 80 executes the control program and controls each part of the plasma processing apparatus 1 according to the recipe data, so that at least a part or all steps of the method MT are executed by the plasma processing apparatus 1.

Figure 4:
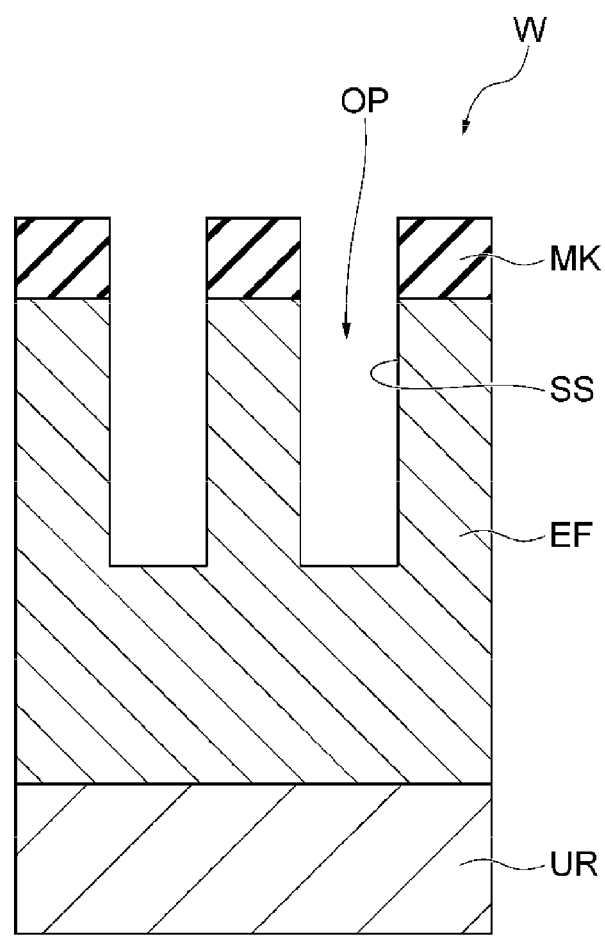
FIG. 4 is a partially enlarged cross-sectional view of an example of a substrate in a state after step ST2 of the substrate processing method illustrated in FIG. 1 is applied.
Figure 5:
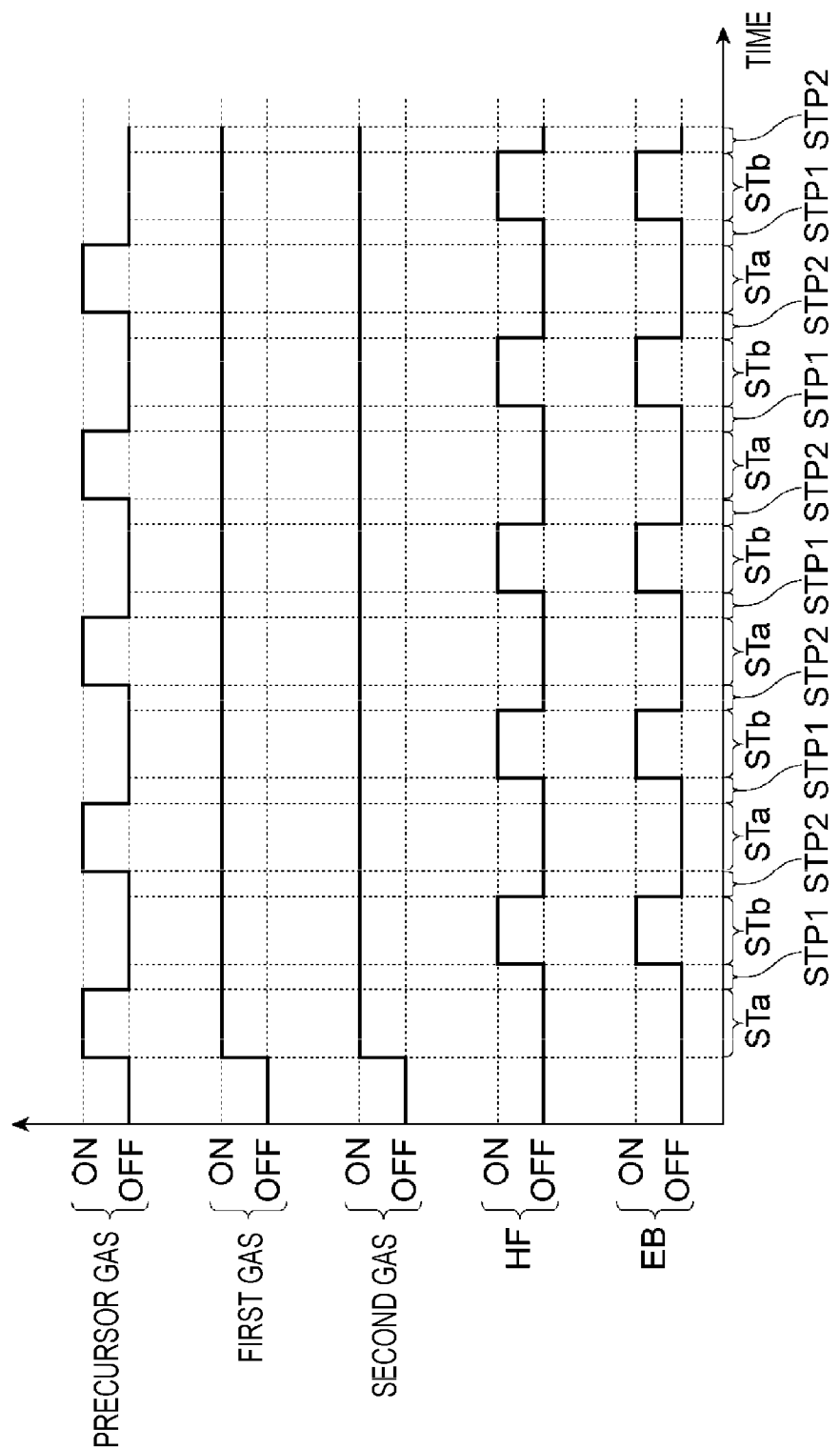
FIG. 5 is a timing chart of an example related to the substrate processing method illustrated in FIG. 1.
Figure 6:
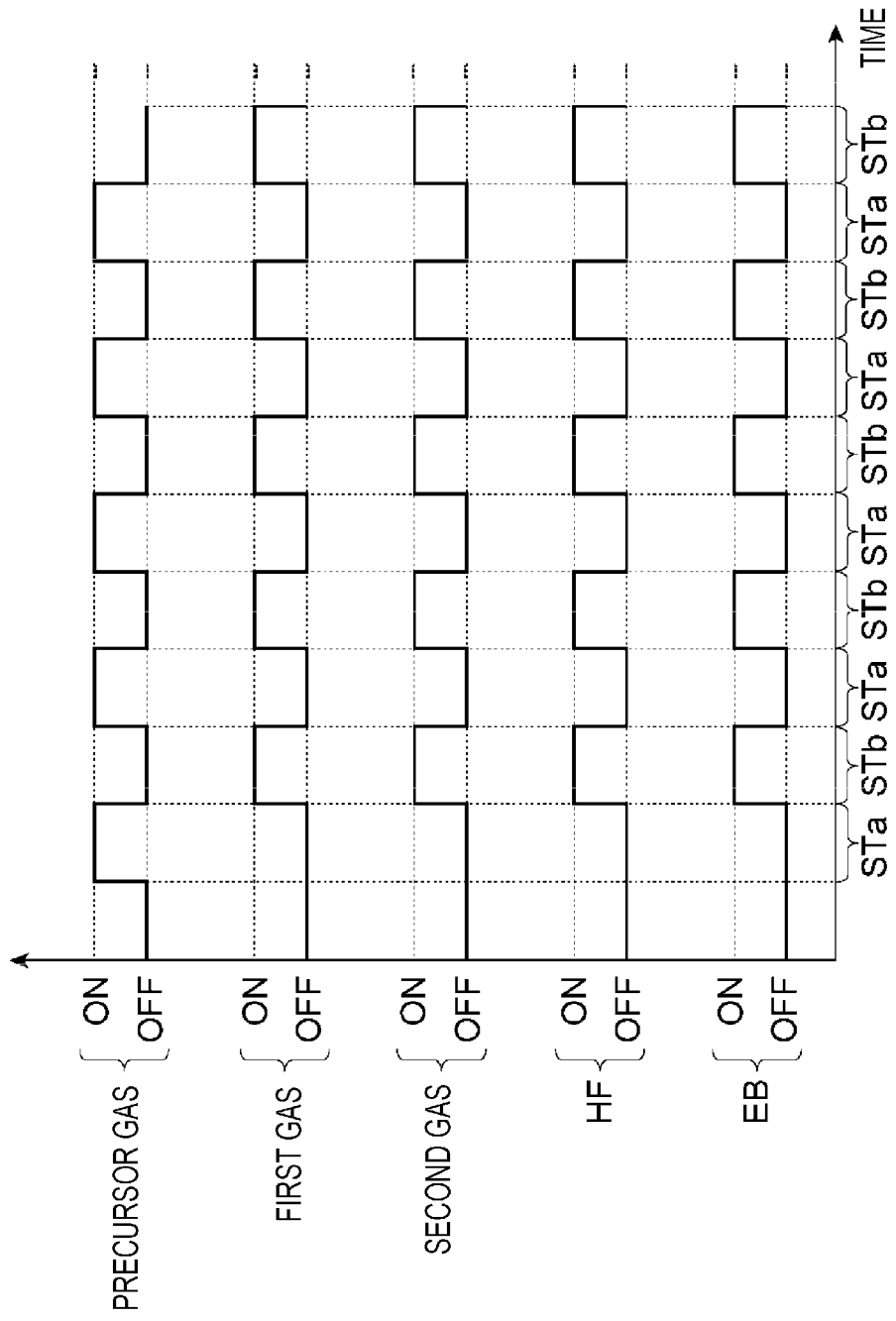
FIG. 6 is a timing chart of another example related to the substrate processing method illustrated in FIG. 1.
Figure 7:
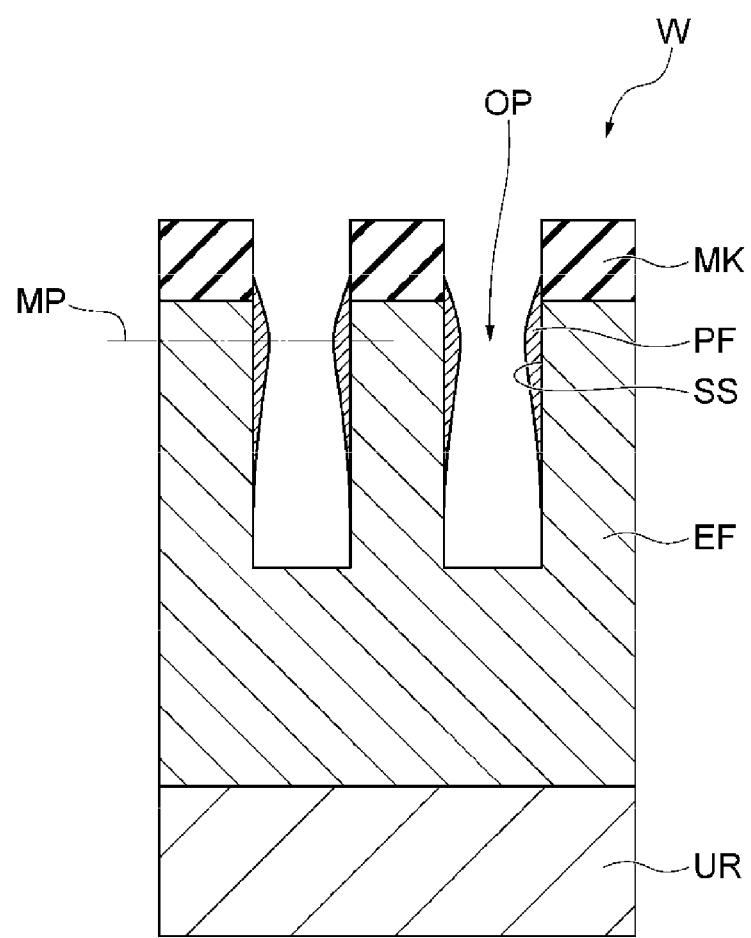
FIG. 7 is a partially enlarged cross-sectional view of an example of a substrate in which a film is formed on a side wall surface in the substrate processing method illustrated in FIG. 1.
Figure 8:
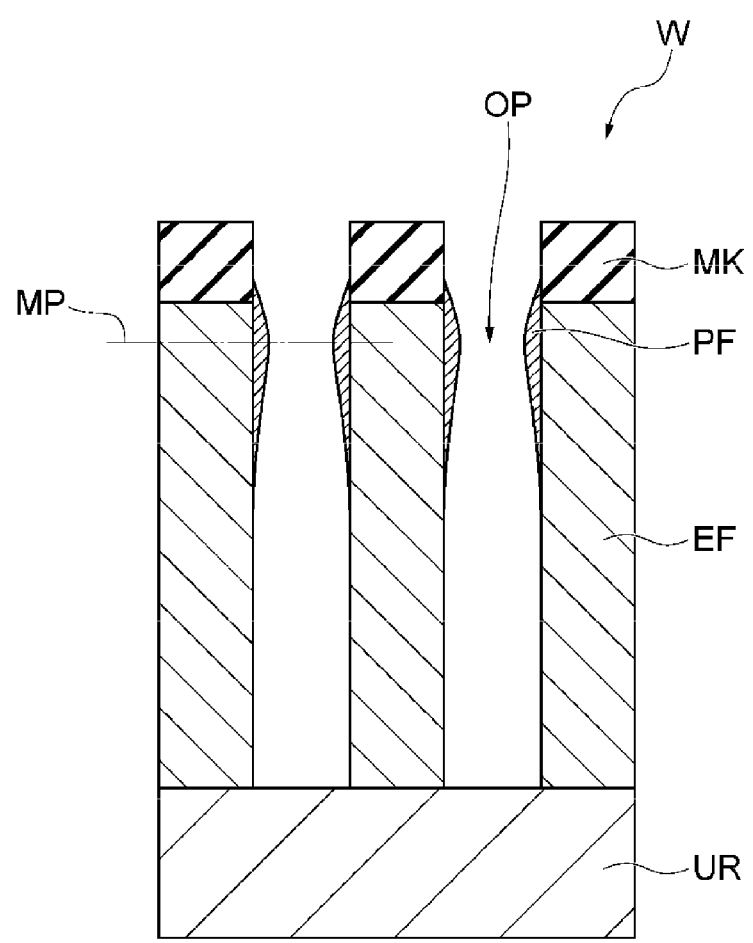
FIG. 8 is a partially enlarged cross-sectional view of an example of a substrate in a state after the substrate processing method illustrated in FIG. 1 is applied.

Referring back to FIG. 1, the method MT will be described in detail. In the following description, the method MT will be described by taking as an example a case where the method MT is applied to the substrate W illustrated in FIG. 2 using the plasma processing apparatus 1. Further, the control of the controller 80 with respect to each part of the plasma processing apparatus 1 will also be described. In the following description, reference will be made to FIGS. 4 to 8 in addition to FIG. 1. FIG. 4 is a partially enlarged cross-sectional view of an example of a substrate in a state after step ST2 of the substrate processing method illustrated in FIG. 1 is applied. FIG. 5 is a timing chart of an example related to the substrate processing method illustrated in FIG. 1. FIG. 6 is a timing chart of another example related to the substrate processing method illustrated in FIG. 1. FIG. 7 is a partially enlarged cross-sectional view of an example of a substrate in which a film is formed on a side wall surface in the substrate processing method illustrated in FIG. 1. FIG. 8 is a partially enlarged cross-sectional view of an example of a substrate in a state after the substrate processing method illustrated in FIG. 1 is applied.

Each of FIGS. 5 and 6 represents that "ON" of the precursor gas indicates that the precursor gas is supplied into the chamber 10, and "OFF" of the precursor gas indicates that the precursor gas is not supplied into the chamber 10. Further, "ON" of the first gas indicates that the first gas is supplied into the chamber 10, and "OFF" of the first gas indicates that the first gas is not supplied into the chamber 10. "ON" of the second gas indicates that the second gas is supplied into the chamber 10, and "OFF" of the second gas indicates that the second gas is not supplied into the chamber 10. "ON" of the radio-frequency power HF indicates that the radio-frequency power HF is supplied, and "OFF" of the radio-frequency power HF indicates that the radio-frequency power HF is not supplied. Further, "ON" of the electrical bias EB indicates that the electrical bias EB is applied to the lower electrode 10, and "OFF" of the electrical bias EB indicates that the electrical bias EB is not applied to the lower electrode 18.

As illustrated in FIG. 1, the method MT starts in step ST1. In step ST1, the substrate W is prepared. The substrate W is placed on the substrate support 14 in the chamber 10 and held by the electrostatic chuck 20.

The method MT may further include step ST2. In step ST2, as illustrated in FIG. 4, the film EF of the substrate W is etched. That is, the film EF is partially etched to a position between the upper surface and the lower surface in the film thickness direction.

In step ST2, the etching gas is supplied into the chamber 10. The etching gas is selected according to the film type of the film EF. When the film EF is a silicon-containing film, the etching gas contains one or more of a fluorocarbon gas, a hydrofluorocarbon gas, and a halogen-containing gas. The halogen-containing gas contains one or more of HBr and C12. The etching gas may further contain a rare gas. In step ST2, plasma is generated from the etching gas in the chamber 10. The film EF is etched by a chemical species from the plasma. By etching in step ST2, the depth of the recess OP is increased to the position inside the film EF. Further, by etching in step ST2, the film EF provides the side wall surface SS that defines the recess OP together with the mask MK.

For step ST2, the controller 80 controls the gas supply GS to supply the etching gas into the chamber 10. Further, the controller 80 controls the exhaust device 50 to set the pressure of the gas in the chamber 10 to a designated pressure. Also, the controller 80 controls the plasma generator to generate plasma from the etching gas. In the plasma processing apparatus 1, the controller 80 controls the radio-frequency power supply 62 and/or the bias power supply 64 to supply the radio-frequency power HF and/or the electrical bias EB.

The method MT may not include step ST2. In this case, the substrate W illustrated in FIG. 4 is placed on the substrate support 14 in the chamber 10 and held by the electrostatic chuck 20 in step ST1.

As illustrated in FIGS. 1, 5, and 6, the method MT further includes steps STa and STb. Steps STa and STb are alternately repeated. That is, a cycle CYA including steps STa and STb is executed a plurality of times. The alternating repetition of steps STa and STb is performed to form the film PF on the side wall surface SS as illustrated in FIG. 7. The film PF may function as a protective film that protects the side wall surface SS in the etching of step STc (to be described later).

In step STa, the precursor gas is supplied into the chamber 10. The precursor gas includes a precursor from which the film PF is formed. In step ST2, the precursor is adsorbed on the surface of the substrate W. The surface of the substrate W includes a side wall surface SS. The precursor gas is selected depending on the material of the film PF. The precursor gas is, for example, a silicon-containing gas such as aminosilane gas.

In step STa, the precursor may be adsorbed on the entire surface of the substrate W. Alternatively, the amount of the precursor adsorbed on the surface of the substrate W in step STa may vary depending on the position on the surface of the substrate W. For example, the amount of precursors adsorbed on the surface of the substrate W may have a distribution such that the amount of precursors adsorbed on the surface of the substrate W decreases as the position in the depth direction in the substrate W increases. In the latter case, at least one selected from the group consisting of the conditions (1) to (5) is satisfied in step STa. Under the condition (1), the pressure of the gas in the chamber 10 during the execution of step STa is set to a pressure lower than the pressure at which the precursor is adsorbed on the entire surface of the substrate W when other processing conditions are the same. Under the condition (2), the processing time of step STa is set to be shorter than the processing time at which the precursor is adsorbed on the entire surface of the substrate W when other processing conditions are the same. Under the condition (3), the dilution degree of the precursor gas is set to a value higher than the dilution degree at which the precursor is adsorbed on the entire surface of the substrate W when other processing conditions are the same. Under the condition (4), the temperature of the substrate support 14 during the execution of step STa is set to a temperature lower than the temperature at which the precursor is adsorbed on the entire surface of the substrate W when other processing conditions are the same. The condition (5) is applicable when plasma is generated in step STa. Under the condition (5), the absolute value of the radio-frequency power (radio-frequency power HF and/or the electrical bias EB) is set to a value smaller than the absolute value at which the precursor is adsorbed on the entire surface of the substrate W when other processing conditions are the same.

For step STa, the controller 80 controls the gas supply GS to supply the precursor gas into the chamber 10. Further, the controller 80 controls the exhaust device 50 to set the pressure of the gas in the chamber 10 to a designated pressure. In step STa, the controller 80 may control the plasma generator to generate plasma from the precursor gas. In the plasma processing apparatus 1, the controller 80 may control the radio-frequency power supply 62 and/or the bias power supply 64 to supply the radio-frequency power HF and/or the bias power supply 64.

As illustrated in FIGS. 1 and 5, the method MT may further include step STP1. Step STP1 is executed between steps STa and STb. In step STP1, the internal space 10s of the chamber 10 is purged. In step STP 1, the exhaust device 50 is controlled by the controller 80, and the gas in the chamber 10 is exhausted. In step STP1, excess precursors on the surface of the substrate W and precursors in the gas phase that are not adsorbed on the substrate W may be removed. Further, as illustrated in FIG. 6, the method MT may not include step STP1.

In step STb, the first chemical species and the second chemical species are supplied to the substrate W. The first chemical species forms a film PF from the precursor on the side wall SS. The first chemical species is generated by generating plasma from the first gas. The first gas may be an oxygen-containing gas such as $O_2$ gas. When the first gas is an oxygen-containing gas, oxygen ions and/or radicals are generated as the first chemical species. When the first gas is an oxygen-containing gas and the precursor contains silicon, a silicon oxide film is formed as the film PF.

In step STb, the second chemical species suppresses the increase in film PF thickness. The second chemical species suppresses an increase in the thickness of the film PF by etching the film PF and/or the precursor, or inhibiting the formation of the film PF on the surface of the substrate W. The second chemical species is generated by generating plasma from the second gas. The second chemical species may be a halogen chemical species. The second chemical species is, for example, a fluorine chemical species. When the second chemical species is a fluorine chemical species, the second gas contains at least one selected from the group consisting of fluorocarbons such as $CF_4$, hydrofluorocarbons, nitrogen trifluoride ($NF_3$), and sulfur hexafluoride ($SF_6$).

In step STb, the reaction between the precursor and the first chemical species may occur evenly on the surface of the substrate W. Alternatively, at least one selected from the group consisting of the conditions (1) to (5) may be satisfied in step STb. Under the condition (1), the pressure of the gas in the chamber 10 during the execution of step STb is set to a pressure lower than the pressure at which the reaction of the first chemical species with all precursors on the surface of the substrate W is completed when other processing conditions are the same. Under the condition (2), the processing time of step STb is set to be shorter than the processing time at which the reaction of the first chemical species with all precursors on the surface of the substrate W is completed when other processing conditions are the same. Under the condition (3), the dilution degree of the first gas is set to a value higher than the dilution degree at which the reaction of the first chemical species with all precursors on the surface of the substrate W is completed when other processing conditions are the same. Under the condition (4), the temperature of the substrate support 14 during the execution of step STb is set to be lower than the temperature at which the reaction of the first chemical species with all precursors on the surface of the substrate W is completed when other processing conditions are the same. Under the condition (5), the absolute value of the radio-frequency power (radio-frequency power HF and/or radio-frequency power LF) is set to a value smaller than the absolute value at which the reaction of the first chemical species with all precursors on the surface of the substrate W is completed when other processing conditions are the same.

For step STb, the controller 80 controls the gas supply GS to supply the first gas and the second gas into the chamber 10. The ratio of the flow rate of the second gas to the sum of the flow rate of the first gas and the flow rate of the second gas may be 10% or more and 90% or less. Further, the controller 80 controls the exhaust device to set the pressure of the gas in the chamber 10 to a designated pressure. Also, the controller 80 controls the plasma generator to generate plasma from the first gas and the second gas. In the plasma processing apparatus 1, the controller 80 controls the radio-frequency power supply 62 and/or the bias power supply 64 to supply the radio-frequency power HF and/or the electrical bias EB. When radio-frequency power HF is used, its power level may be 100 W or higher. When radio-frequency power LF is used, its power level may be greater than 0 W and less than or equal to 1000 W. When the electrical bias EB is used, the pulsed electrical bias EB may be supplied intermittently or periodically in step STb.

As illustrated in FIGS. 1 and 5, the method MT may further include step STP2. Step STP2 is executed between steps STa and STb. Step STP2 is the same step as step STP1. Further, as illustrated in FIG. 6, the method MT may not include step STP2.

It is determined in step STJ1 whether the stop condition has been satisfied. The stop condition has been satisfied, for example, when the number of alternating repetitions of steps STa and STb (the number of cycles CYA) reaches a predetermined number of times. When it is determined in step STJ1 that the stop condition has not been satisfied, the process from step STa is executed again. Meanwhile, when it is determined in step STJ1 that the stop condition has been satisfied, the process may transition to step STc.

In step STc, the film EF is further etched to increase the depth of the recess OP. In step STc, the etching gas is supplied into the chamber 10. The etching gas may be a gas that is the same as the etching gas described above related to step ST2. In step STc, plasma is generated from the etching gas in the chamber 10. The film EF is etched by the chemical species from the plasma.

For step STc, the controller 80 controls the gas supply GS to supply the etching gas into the chamber 10. Further, the controller 80 controls the exhaust device 50 to set the pressure of the gas in the chamber 10 to a designated pressure. Also, the controller 80 controls the plasma generator to generate plasma from the etching gas. In the plasma processing apparatus 1, the controller 80 controls the radio-frequency power supply 62 and/or the bias power supply 64 to supply the radio-frequency power HF and/or the electrical bias EB.

The method MT may be ended after step STc is executed once. Alternatively, a cycle CYB including a plurality of cycles CYAs and step STc may be executed multiple times. In the latter case, the method MT includes step STJ2. In step STJ2, it is determined whether the stop condition has been satisfied. The stop condition has been satisfied, for example, when the number of cycles CYB reaches a predetermined number of times. When it is determined in step STJ2 that the stop condition has not been satisfied, the cycle CYB is executed again. Meanwhile, when it is determined in step STJ2 that the stop condition has been satisfied, the method MT is ended. At the end of the method MT, the film EF may be in an etched state until the underlying region UR is exposed, as illustrated in FIG. 8.

In the method MT, the side wall SS is protected by the film PF when the etching of step STc is being performed. Therefore, the etching of step STc suppresses the recess OP from expanding in the lateral direction.

Further, in the method MT, a film PF is formed on the side wall surface SS by the reaction between the precursor and the first chemical species. The second chemical species suppresses the increase in the thickness of the film PF, especially at the opening site (i.e., the end) of the recess OP. Therefore, according to the method MT, the closure of the opening of the recess OP performed by the film PF is suppressed.

Further, in the method MT, the position MP in the depth direction in the recess OP on which the film PF is formed may be adjusted by one or both of adjusting the flow rate of the second gas and adjusting the magnitude of the electrical bias. The position MP may be defined as the position where the film PF has the maximum film thickness on the side wall surface SS. Specifically, in the method MT, the position MP in the depth direction in the recess OP on which the film PF is formed may be adjusted to a deeper position in the depth direction of the recess OP according to an increase in the flow rate of the second gas used in step STb. Further, when the flow rate of the second gas used in step STb is relatively large, as a result of the first chemical species being used in the reaction with the second chemical species, the formation of the film PF in the deep part of the recess OP is suppressed.

In the method MT, it is possible to adjust the position MP in the depth direction in the recess OP on which the film PF is formed to a deeper position in the depth direction of the recess OP in accordance with an increase in the magnitude of the electrical bias EB used in step STb. Further, the adjustment of the magnitude of the electrical bias EB makes it possible to adjust the position MP in a range including a deeper position as compared with the adjustment of the flow rate of the second gas. When the magnitude of the electrical bias EB becomes larger, the film PF is etched in the vicinity of the opening of the recess OP, and the first chemical species reaches the deep region of the recess OP to modify the precursor. The magnitude of the electrical bias EB is the absolute value of the power level of the radio-frequency power LF or the voltage level of the pulse of the negative DC voltage.

In an embodiment, the magnitude of the electrical bias EB may be changed in the alternating repetition of steps STa and STb, that is, in a plurality of cycles CYA. According to this embodiment, it is possible to change the position MP in the depth direction in the recess OP on which the film is formed by alternately repeating steps (a) and (b).

In an embodiment, the plurality of cycles CYBs include a first cycle and a second cycle. The first cycle and the second cycle are executed in sequence. The magnitude of the electrical bias EB applied to the lower electrode 18 in step STb within the first cycle may be different from the magnitude of the electrical bias EB applied to the lower electrode 18 in step STb within the second cycle.

In an embodiment, the magnitude of the electrical bias EB used in step STb within the second cycle may be greater than the magnitude of the electrical bias EB used in the first cycle. For example, as the number of executions of the plurality of cycles CYBs increases, the magnitude of the electrical bias EB used in step STb may increase. According to this embodiment, it is possible to form the film PF at a deeper portion in the recess OP according to the depth of the recess OP.

In an embodiment, as illustrated in FIG. 5, the first gas and the second gas may be continuously supplied into the chamber 10 while steps STa and STb are alternately repeated. In this embodiment, the plasma generated from the first gas and the second gas is generated only during the period in which step STb is performed. Alternatively, as illustrated in FIG. 6, the first gas and the second gas may be supplied only during the period in which step STb is performed. Further, in the example illustrated in FIG. 6, the method MT may include steps STP1 and STP2 as in the example illustrated in FIG. 5.

Figure 9:
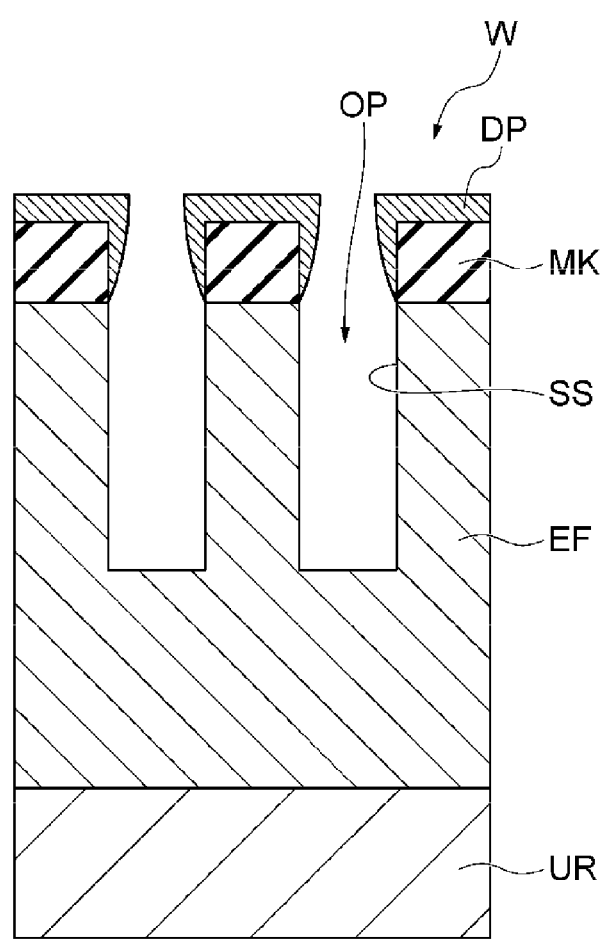
FIG. 9 is a partially enlarged cross-sectional view of an example of a substrate in a state before the alternating repetition of steps STa and STb is applied in the substrate processing method illustrated in FIG. 1.

Hereinafter, reference is made to FIG. 9. FIG. 9 is a partially enlarged cross-sectional view of an example of a substrate in a state before the alternating repetition of steps STa and STb is applied in the substrate processing method illustrated in FIG. 1. In an embodiment, as illustrated in FIG. 9, a deposit DP may be present on the side wall surface SS of the substrate W before the alternating repetition of steps STa and STb is applied to the substrate W. For example, the deposit DP may be present on the top of the mask MK and on the side wall SS near the opening of the recess OP. The deposit DP is a by-product generated by etching in step ST2. When the film EF is a silicon-containing film as described above, the deposit DP may contain silicon. The deposit DP may be formed on the side wall surface SS in the vicinity of the opening of the recess OP.

In step STb of an embodiment, the deposit DP present on the side wall surface SS above the upper part of the mask MK and near the opening of the recess OP is etched (removed) while protecting the side wall surface SS with the film PF, as illustrated in FIGS. 7 and 8. Further, in step STb, the film PF is etched in the vicinity of the opening of the recess OP in a state where the side wall surface SS is protected by the film PF. When the deposit DP contains silicon, the processing gas used in step STb contains an oxygen-containing gas as the first gas and a fluorine-containing gas as the second gas. The oxygen-containing gas is, for example, $O_2$ gas. The fluorine-containing gas contains at least one selected from the group consisting of fluorocarbon such as $CF_4$, hydrofluorocarbon, nitrogen trifluoride, and sulfur hexafluoride. In an embodiment, the flow rate of the fluorine-containing gas in the processing gas used in step STb is larger than the flow rate of the oxygen-containing gas in the processing gas. According to such a method MT, it is possible to protect the side wall surface SS by the film PF while suppressing the closure of the opening of the recess OP performed by the deposit DP.

Figure 10:
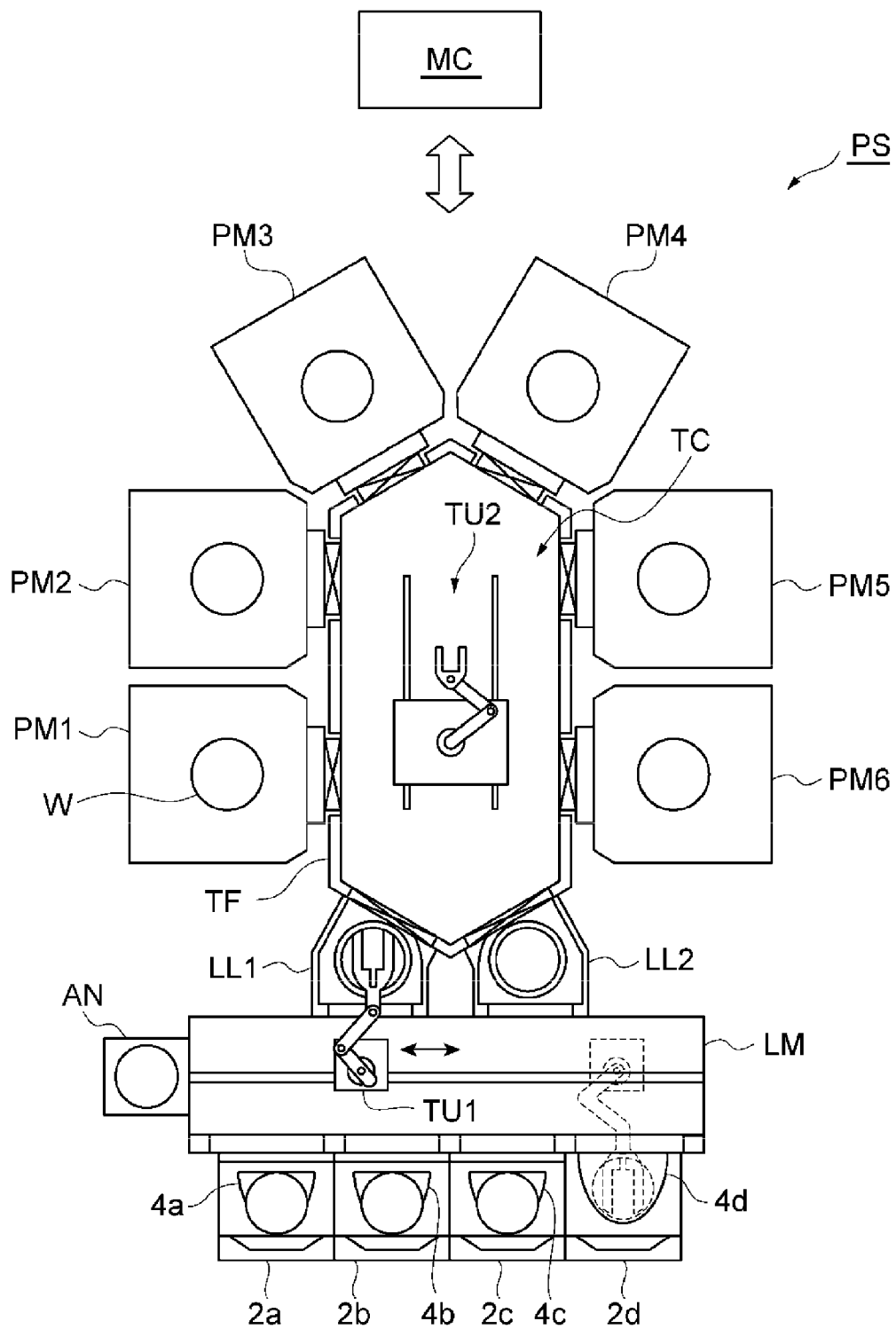
FIG. 10 is a view schematically illustrating a substrate processing system according to the embodiment.

Hereinafter, reference is made to FIG. 10. FIG. 10 is a view schematically illustrating a substrate processing system according to an embodiment. In the method MT, the substrate processing system PS illustrated in FIG. 10 may be used.

The substrate processing system PS includes pedestals $2a$ to $2d$, containers $4a$ to $4d$, a loader module LM, an aligner AN, load lock modules LL1 and LL2, process modules PM1 to PM6, a transfer module TF, and a controller MC. The number of pedestals, the number of containers, and the number of load lock modules in the substrate processing system PS may be any one or more. Further, the number of process modules in the substrate processing system PS may be any one or more.

The pedestals $2a$ to $2d$ are arranged along one edge of the loader module LM. The containers $4a$ to $4d$ are mounted on the pedestals $2a$ to $2d$, respectively. Each of the containers $4a$ to $4d$ is, for example, a container called a front opening unified pod (FOUP). Each of the containers $4a$ to $4d$ is configured to accommodate the substrate W inside the container $4a$ to $4d$.

The loader module LM has a chamber. The pressure in the chamber of the loader module LM is set to an atmospheric pressure. The loader module LM has a transfer device TU1. The transfer device TU1 is, for example, an articulated robot and is controlled by the controller MC. The transfer device TU1 is configured to transfer the substrate W through the chamber of the loader module LM. The transfer device TU1 may transfer the substrate W between each of the containers $4a$ to $4d$ and the aligner AN, between the aligner AN and each of the load lock modules LL1 and LL2, and between each of the load lock modules LL1 and LL2, and each of the containers $4a$ to $4d$. The aligner AN is connected to the loader module LM. The aligner AN is configured to adjust the position of the substrate W (correct the position thereof).

Each of the load lock modules LL1 and LL2 is provided between the loader module LM and the transfer module TF. Each of the load lock modules LL1 and LL2 provides a preliminary decompression chamber.

The transfer module TF is connected to each of the load lock modules LL1 and LL2 via a gate valve. The transfer module TF has a transfer chamber TC capable of depressurizing. The transfer module TF has a transfer device TU2. The transfer device TU2 is, for example, an articulated robot and is controlled by the controller MC. The transfer device TU2 is configured to transfer the substrate W through the transfer chamber TC. The transfer device TU2 may transfer the substrate W between each of the load lock modules LL1 and LL2 and each of the process modules PM1 to PM6, and between any two process modules of the process modules PM1 to PM6.

Each of the process modules PM1 to PM6 is an apparatus configured to perform a dedicated substrate processing. One of the process modules PM1 to PM6 is a plasma processing apparatus used in steps ST2 and STc. Another process module among the process modules PM1 to PM6 may be a plasma processing apparatus used in step STc. The plasma processing apparatus used in each of steps ST2 and STc may have the same configuration as the plasma processing apparatus 1.

Yet another process module among the process modules PM1 to PM6 is a plasma processing apparatus used for alternately repeating steps STa and STb. The plasma processing apparatus used for alternately repeating steps STa and STb may have the same configuration as the plasma processing apparatus 1.

In the substrate processing system PS, the controller MC is configured to control each part of the substrate processing system PS. The controller MC controls each part of the plasma processing apparatus to etch the film EF in step ST2. The controller MC controls each part of the plasma processing apparatus to form a film PF on the side wall surface SS in the alternating repetition of steps STa and STb. The controller MC controls each part of the plasma processing apparatus to etch the film EF in step STc. The control of the plasma processing apparatus by the substrate processing system PS in each of these steps is the same as the control of each part of the plasma processing apparatus 1 by the controller 80 described above. The substrate processing system PS may transfer the substrate W between process modules without contacting the atmosphere during execution of the method MT.

Although various embodiments have been described above, the present disclosure is not limited to the embodiments described above, and various omissions, substitutions, and changes may be made. In addition, it is possible to combine the elements in different embodiments to form other embodiments.

For example, the plasma processing apparatus used to execute the method MT may be a capacitively coupled plasma processing apparatus different from the plasma processing apparatus 1. The plasma processing apparatus used to execute the method MT may be a type of plasma processing apparatus different from the capacitive coupling type. Such a plasma processing apparatus is, for example, an inductively coupled plasma processing apparatus, an electron cyclotron resonance (ECR) plasma processing apparatus, or a plasma processing apparatus that generates plasma from a gas by a surface wave such as a microwave.

Further, after the film EF is partially etched as in step ST2, the width of the recess OP (CD before the film formation) before the formation of the film PF may be measured by using a system that optically measures the pattern shape, and the required film formation amount of the film PF may be calculated. Then, the film forming conditions of the film PF may be determined according to the calculated film formation amount. The film forming conditions include the number of cycles CYAs, the gas flow rate (the flow rate of the first gas and the flow rate of the second gas), and the magnitude of the electrical bias EB. The number of cycles CYAs may be determined based on the film formation amount of the film PF per cycle CYA. For the gas flow rate and/or the electrical bias EB, the relationship between the gas flow rate and/or the film formation position (position MP) of the film PF or the distribution of the film formation amount of the film PF with respect to the electrical bias EB may be acquired in advance, and based on such a relationship, it may be determined so that the desired distribution of the film formation amount of the film PF can be obtained.

In addition, the width of the recess OP after the formation of the film PF (CD after the film formation), the film formation amount of the film PF, and/or the film formation position of the film PF may be compared with their desired values by using a system that optically measures the pattern shape. When the width of the recess OP after the formation of the film PF (CD after the film formation), the film formation amount of the film PF, and/or the film formation position of the film PF have an unacceptable error with respect to their desired values, the film forming conditions may be corrected. In the method MT, the following substrates may be processed under the corrected film forming conditions.

A system that optically measures the pattern shape may be incorporated in the substrate processing system. In an example, the system that optically measures the pattern shape may be connected to a load port (an apparatus including the pedestals 2a to 2d and the containers 4a to 4d) of the substrate processing system PS. Alternatively, the system that optically measures the pattern shape may be connected to the transfer chamber TC. The system that optically measures the pattern shape may be a system independent of the substrate processing system PS.

Hereinafter, descriptions will be made on several experiments performed for evaluation of the method MT. The experiments described below do not limit the present disclosure.

First to Fourth Experiments

In first to fourth experiments, a plurality of sample substrates having the same structure as the substrate W illustrated in FIG. 4 was prepared. In each of the plurality of sample substrates, the mask MK was formed of polycrystalline silicon and had a thickness of about 300 nm (0.3 µm). In each of the plurality of sample substrates, the film EF was formed from a silicon oxide film. The recess OP had a depth of about 2,000 nm (2.0 µm). In the first to fourth experiments, alternating repetition of steps STa and STb was applied to a plurality of sample substrates to form the film PF on the side wall surface SS. $O_2$ gas was used as the first gas, and $CF_4$ gas was used as the second gas. The flow rates of the second gas in step STb of the first to fourth experiments were 0 sccm, 50 sccm, 100 sccm, and 150 sccm, respectively. Other conditions of the first to fourth experiments are represented below.

Figure 11A:
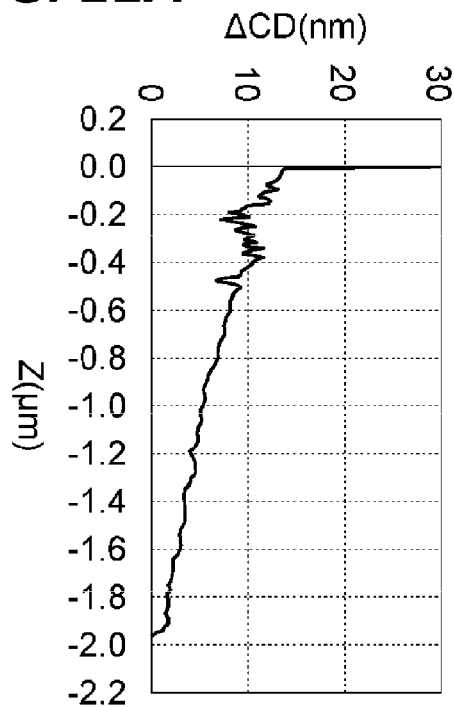
FIGS. 11A to 11D are graphs illustrating the distribution of $\Delta CD$ in the depth direction obtained in first to fourth experiments, respectively.
Figure 11B:
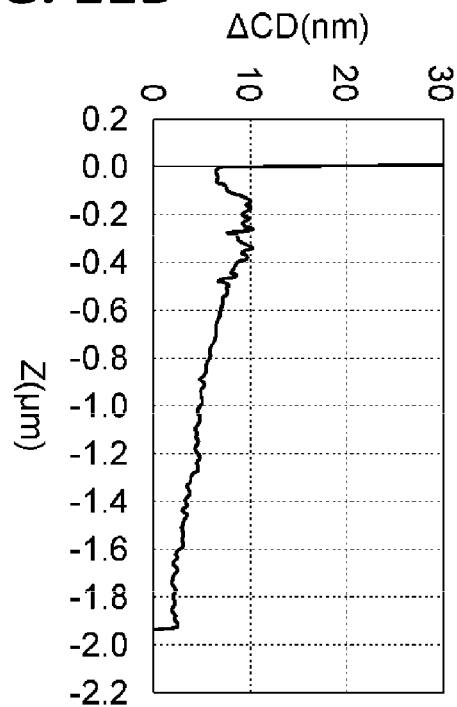
Figure 11C:
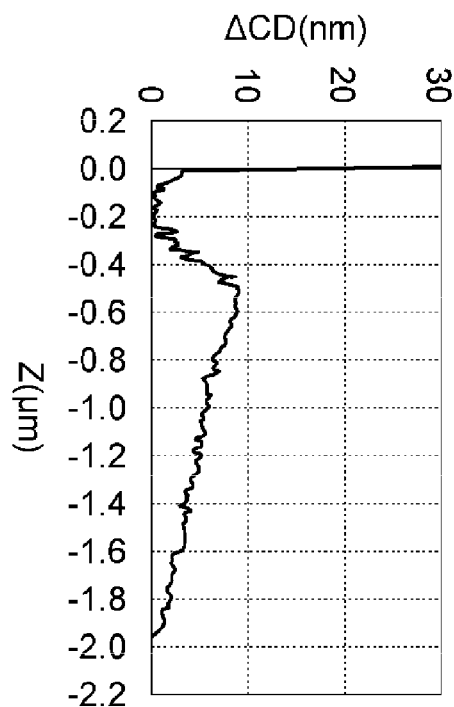
Figure 11D:
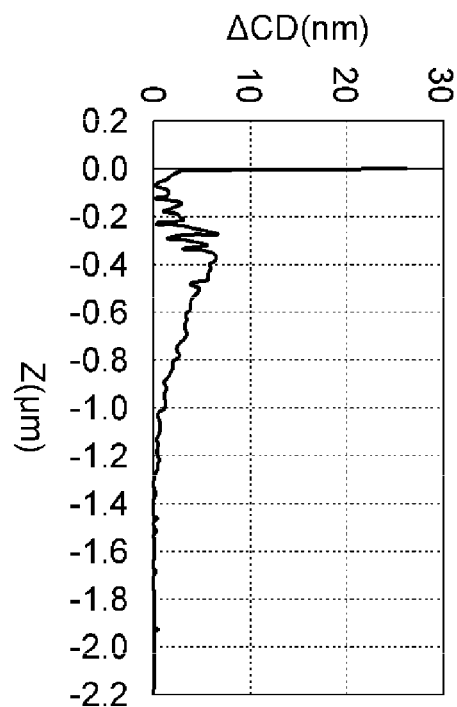

<Conditions of First to Fourth Experiments>
Step Sta
  Processing gas containing a precursor gas: Mixed gas of aminosilane gas, $O_2$ gas, and $CF_4$ gas
  Gas pressure in the chamber 10: 10 mTorr (1.333 Pa)
  Processing time: 2 seconds
Step STP1
  Gas supplied into the chamber 10: Mixed gas of $O_2$ gas and $CF_4$ gas
  Gas pressure in the chamber 10: 10 mTorr (1.333 Pa)
  Processing time: 1.5 seconds
Step STb
  First gas and second gas: Mixed gas of $O_2$ gas and $CF_4$ gas
  Gas pressure in the chamber 10: 10 mTorr (1.333 Pa)
  Radio-frequency power HF: 0 W
  Radio-frequency power LF: 40 MHz, 150 W
  Processing time: 2 seconds
Step STP2
  Gas supplied into the chamber 10: Mixed gas of $O_2$ gas and $CF_4$ gas
  Gas pressure in the chamber 10: 10 mTorr (1.333 Pa)
  Processing time: 1 second
  Number of alternate repetitions of steps STa and STb: 50 times In the first to fourth experiments, a difference between the width of the recess OP before the formation of the film PF and the width of the recess OP after the formation of the film PF, that is, the distribution of ΔCD in the recess OP in the depth direction was calculated. ΔCD reflects the thickness of the film PF. FIGS. 11A to 11D are graphs illustrating the distribution of ΔCD in the depth direction obtained in the first to fourth experiments, respectively. In these figures, Z on the vertical axis indicates a position in the recess OP in the depth direction. The position where Z is 0.0 µm is the position on the upper surface of the mask MK. The absolute value of the negative value of Z represents the distance in the depth direction from the upper surface of the mask MK. When the second gas was not supplied in step STb, the thickness of the film PF increased in the vicinity of the opening of the recess OP, as illustrated in FIG. 11A. Meanwhile, as illustrated in FIGS. 11B to 11D, it was confirmed that it is possible to reduce the thickness of the film PF at the opening of the recess OP by supplying the substrate with the second chemical species derived from the second gas in step STb. That is, it was confirmed that it is possible to suppress the closure of the recess OP by the film PF by supplying the second gas into the chamber and supplying the second chemical species to the substrate in step STb. Further, it was confirmed that as the flow rate of the second gas used in step STb becomes larger, the position where the film PF is formed in the recess OP is adjusted to a deeper position. Further, as illustrated in FIG. 11D, it was confirmed that, when the flow rate of the second gas used in step STb is relatively large, the formation of the film PF at the deep position of the recess OP is suppressed.

Fifth to Seventh Experiments

In fifth to seventh experiments, a plurality of sample substrates having the same structure as the substrate W illustrated in FIG. 4 was prepared. In each of the plurality of sample substrates, the mask MK was formed of polycrystalline silicon and had a thickness of about 300 nm (0.3 µm). In each of the plurality of sample substrates, the film EF was formed from a silicon oxide film. The recess OP had a depth of about 2000 nm (2.0 µm). In the fifth to seventh experiments, alternating repetition of steps STa and STb was applied to a plurality of sample substrates to form the film PF on the side wall surface SS. $O_2$ gas was used as the first gas, and $CF_4$ gas was used as the second gas. The magnitudes of the radio-frequency power LF in steps STb of the fifth to seventh experiments were 150 W, 250 W, and 500 W. Other conditions of the fifth to seventh experiments are represented below.

Figure 12A:
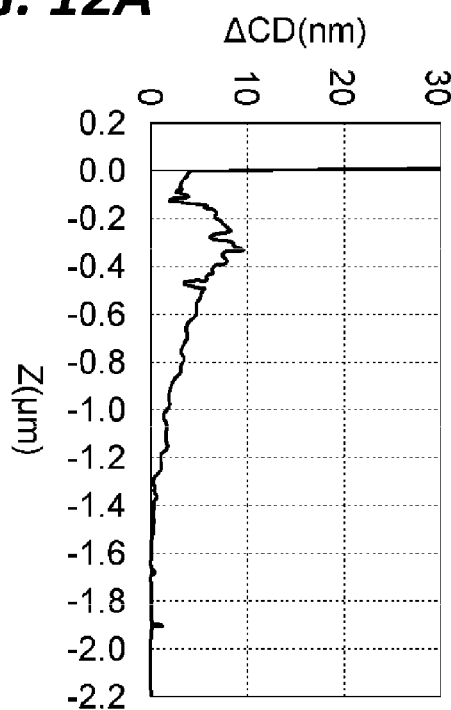
FIGS. 12A to 12C are graphs illustrating the distribution of $\Delta CD$ in the depth direction obtained in fifth to seventh experiments, respectively.
Figure 12B:
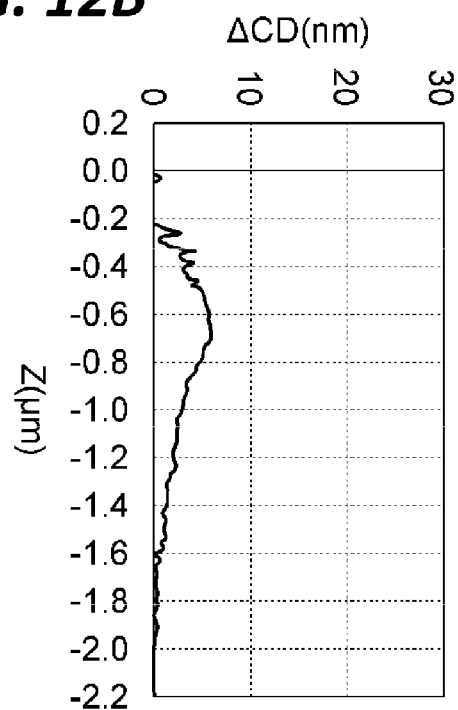
Figure 12C:
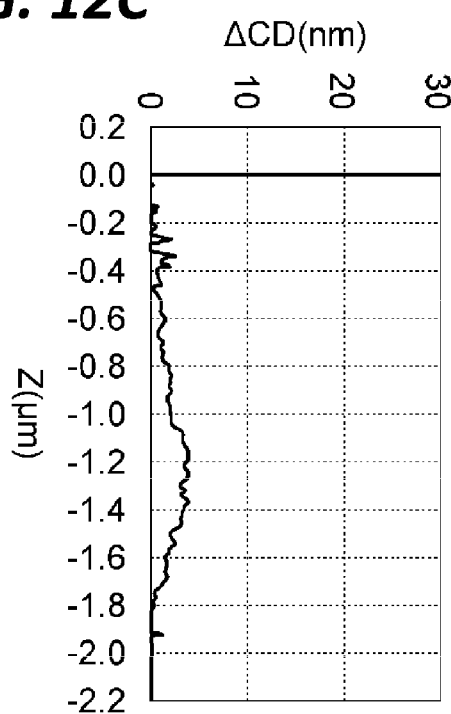

<Conditions of Fifth to Seventh Experiments>
Step Sta
  Processing gas containing a precursor gas: Mixed gas of aminosilane gas, $O_2$ gas, and $CF_4$ gas
  Gas pressure in the chamber 10: 10 mTorr (1.333 Pa)
  Processing time: 2 seconds
Step STP1
  Gas supplied into the chamber 10: Mixed gas of $O_2$ gas and $CF_4$ gas
  Gas pressure in the chamber 10: 10 mTorr (1.333 Pa)
  Processing time: 1.5 seconds
Step STb
  First gas and second gas: Mixed gas of $O_2$ gas and $CF_4$ gas
  Gas pressure in the chamber 10: 10 mTorr (1.333 Pa)
  Radio-frequency power HF: 0 W
  Radio-frequency power LF: 40 MHz
  Processing time: 2 seconds
Step STP2
  Gas supplied into the chamber 10: Mixed gas of $O_2$ gas and $CF_4$ gas
  Gas pressure in the chamber 10: 10 mTorr (1.333 Pa)
  Processing time: 1 second
  Number of alternate repetitions of steps STa and STb: 50 times In the fifth to seventh experiments, as in the first to fourth experiments, the distribution of ΔCD in the recess OP in the depth direction was determined. FIGS. 12A to 12C are graphs illustrating the distribution of ΔCD in the depth direction obtained in the fifth to seventh experiments, respectively. As illustrated in of FIGS. 12A to 12C, it was confirmed that as the magnitude of the radio-frequency power LF (i.e., the electrical bias EB) used in step STb becomes larger, the film PF in the recess OP was formed at a deeper position. Further, it was confirmed that the adjustment of the magnitude of the electrical bias EB makes it possible to adjust the position where the film PF is formed (position MP) in a range including a deeper position as compared with the adjustment of the flow rate of the second gas.

Eighth to Tenth Experiments

In eighth to tenth experiments, a plurality of sample substrates having the same structure as the substrate W illustrated in FIG. 4 were prepared. In each of the plurality of sample substrates, the mask MK was formed of polycrystalline silicon and had a thickness of about 300 nm (0.3 μm). In each of the plurality of sample substrates, the film EF was formed from a silicon oxide film. The recess OP had a depth of about 2,000 nm (2.0 μm). In the eighth to tenth experiments, a deposit DP formed from silicon oxide was formed on the side wall surface SS of each of the plurality of sample substrates by plasma CVD to obtain a sample substrate having the same structure as the substrate W illustrated in FIG. 9. In the eighth to tenth experiments, alternating repetition of steps STa and STb was applied to a plurality of sample substrates to form the film PF on the side wall surface SS. $O_2$ gas was used as the first gas and $CF_4$ gas was used as the second gas. In the processing gas used in step STb of the eighth to tenth experiments, the flow rate of $CF_4$ gas was larger than the flow rate of $O_2$ gas. Specifically, the flow rates of the $O_2$ gas and the $CF_4$ gas in the processing gas used in step STb of the eighth experiment were 170 sccm and 280 sccm, respectively. Further, the flow rates of the $O_2$ gas and the $CF_4$ gas in the processing gas used in step STb of the ninth experiment were 100 sccm and 280 sccm, respectively. Also, the flow rates of the $O_2$ gas and the $CF_4$ gas in the processing gas used in step STb of the tenth experiment were 20 sccm and 280 sccm, respectively. Other conditions of the eighth to tenth experiments are represented below.

Figure 13A:
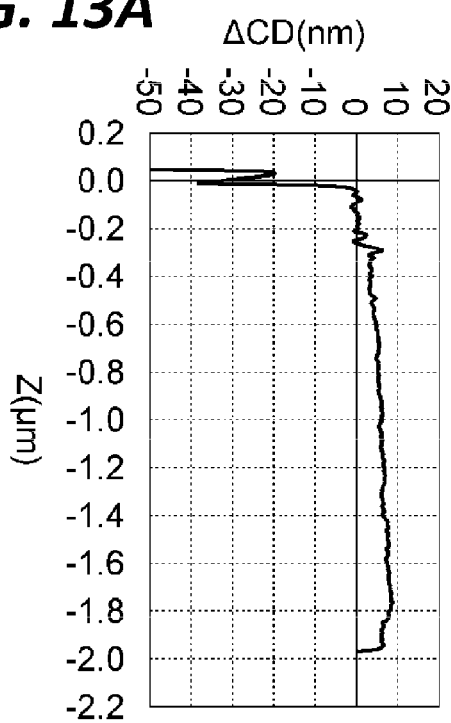
FIGS. 13A to 13C are graphs illustrating the distribution of $\Delta CD$ in the depth direction obtained in eighth to tenth experiments, respectively.
Figure 13B:
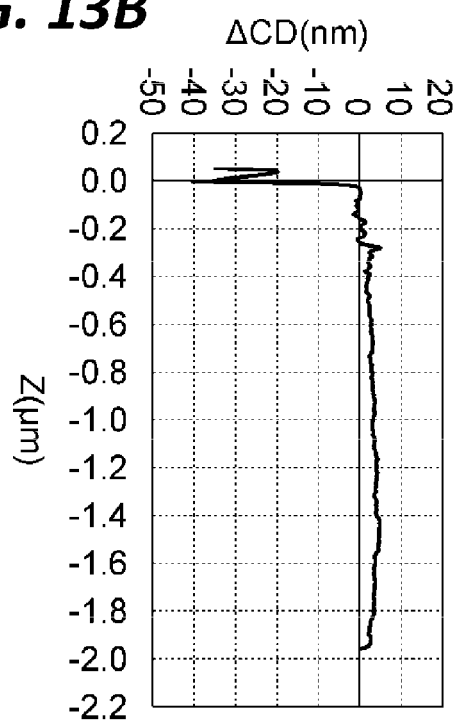
Figure 13C:
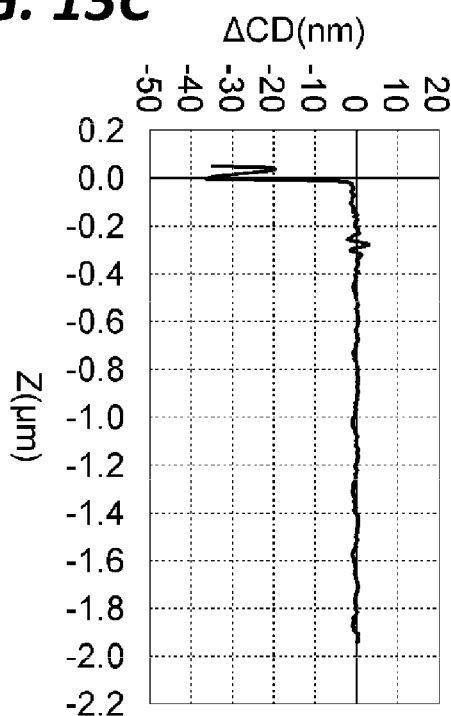

<Conditions of Eighth to Tenth Experiments>
Step Sta
 Processing gas containing a precursor gas: Mixed gas of aminosilane gas, $O_2$ gas, and $CF_4$ gas
 Gas pressure in the chamber 10: 10 mTorr (1.333 Pa)
 Processing time: 2 seconds
Step STP1
 Gas supplied into the chamber 10: Mixed gas of $O_2$ gas and $CF_4$ gas
 Gas pressure in the chamber 10: 10 mTorr (1.333 Pa)
 Processing time: 1.5 seconds
Step STb
 First gas and second gas: Mixed gas of $O_2$ gas and $CF_4$ gas
 Gas pressure in the chamber 10: 10 mTorr (1.333 Pa)
 Radio-frequency power HF: 0 W
 Radio-frequency power LF: 40 MHz, 250 W
 Processing time: 2 seconds
Step STP2
 Gas supplied into the chamber 10: Mixed gas of $O_2$ gas and $CF_4$ gas
 Gas pressure in the chamber 10: 10 mTorr (1.333 Pa)
 Processing time: 1 second
 Number of alternate repetitions of steps STa and STb: 50 times In the eighth to tenth experiments, as in the first to seventh experiments, the distribution of ΔCD in the recess OP in the depth direction was determined. FIGS. 13A to 13C are graphs illustrating the distribution of ΔCD in the depth direction obtained in the eighth to tenth experiments, respectively. As illustrated in FIGS. 13A to 13C, the ΔCDs obtained in the eighth to tenth experiments had a negative value at the position where Z was 0.0 μm, that is, at the position in the depth direction near the opening of the recess OP. From this, it was confirmed that the deposit DP was etched when the flow rate of $CF_4$ gas in the processing gas was larger than the flow rate of $O_2$ gas. Further, the ΔCD obtained in the eighth to tenth experiments was 0 or more at a position deeper than the opening of the recess OP. From this, it was confirmed that the side wall surface SS was protected in the eighth to tenth experiments. It was also confirmed that the thickness of the film PF formed decreases as the flow rate of $CF_4$ gas in the processing gas increases with respect to the flow rate of $O_2$ gas.

According to the embodiment, the closure of the opening of the recess by the film formed on the substrate is suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing method comprising:
 (a) adsorbing a precursor from a precursor gas to a side wall surface of a substrate, the side wall surface defining a recess in the substrate; and
 (b) forming a film from the precursor on the side wall surface by supplying a first chemical species to the substrate and suppressing an increase of a thickness of the film by supplying a second chemical species to the substrate, the first chemical species being supplied from plasma generated from a first gas and the second chemical species being supplied from plasma generated from a second gas, and
 wherein as (a) and (b) are alternately repeated, a radio-frequency power and an electrical bias to form the plasma are applied during (b), wherein there is no radio-frequency power and no electrical bias applied during (a).
2. The substrate processing method according to claim 1, wherein the second chemical species is a halogen chemical species.
3. The substrate processing method according to claim 2, wherein the second chemical species is a fluorine chemical species.
4. The substrate processing method according to claim 3, wherein the second chemical species supplied from the plasma generated from the second gas is generated from at least one selected from the group consisting of fluorocarbon, hydrofluorocarbon, nitrogen trifluoride, and sulfur hexafluoride.
5. The substrate processing method according to claim 2, wherein the precursor contains silicon.

6. The substrate processing method according to claim 1, wherein a deposit on the side wall surface is etched in (b).

7. The substrate processing method according to claim 6, further comprising:
before (a) and (b) are alternately repeated, etching an etching film of the substrate to form the recess,
wherein the deposit is formed on the side wall surface by the etching of the etching film.

8. The substrate processing method according to claim 6, wherein the deposit and the precursor contain silicon,
the first gas is an oxygen-containing gas, and
the second gas is a fluorine-containing gas.

9. The substrate processing method according to claim 8, wherein in (b), plasma is generated from a processing gas containing the oxygen-containing gas and the fluorine-containing gas, and a flow rate of the fluorine-containing gas in the processing gas is higher than a flow rate of the oxygen-containing gas in the processing gas.

10. The substrate processing method according to claim 8, wherein the fluorine-containing gas contains at least one selected from the group consisting of fluorocarbon, hydrofluorocarbon, nitrogen trifluoride, and sulfur hexafluoride.

11. The substrate processing method according to claim 1, wherein in (b), the electrical bias is applied to a lower electrode of a substrate support that supports the substrate.

12. The substrate processing method according to claim 1, further comprising:
purging an inner space of a chamber that accommodates the substrate therein between (a) and (b) and/or between (b) and (a).

13. The substrate processing method according to claim 1, wherein in (b), a ratio of a flow rate of the second gas to a sum of a flow rate of the first gas and the flow rate of the second gas is 10% or more and 90% or less.

14. A substrate processing method comprising:
(a) adsorbing a precursor to a side wall surface of a substrate, the side wall surface defining a recess in the substrate;
(b) forming a film from the precursor on the side wall surface by supplying a first chemical species to the substrate and suppressing an increase of a thickness of the film by supplying a second chemical species to the substrate,
wherein as (a) and (b) are alternately repeated, a radio-frequency power and an electrical bias to form a plasma are applied during (b), wherein there is no radio-frequency power and no electrical bias applied during (a), and (c) etching the substrate using plasma generated from an etching gas to increase a depth of the recess after the alternately repeating of (a) and (b),
wherein the film protects the side wall surface in the etching of (c).

15. The substrate processing method according to claim 14, wherein a first cycle including the alternately repeating of (a) and (b), and (c), and a second cycle including the alternately repeating (a) and (b), and (c), are executed sequentially, and
in (b) within the first cycle, a magnitude of an electrical bias applied to a lower electrode is different from a magnitude of the electrical bias applied to the lower electrode in (b) within the second cycle.

16. The substrate processing method according to claim 15, wherein the magnitude of the electrical bias used in (b) within the second cycle is greater than the magnitude of the electrical bias used (b) within the first cycle.

17. A plasma processing apparatus comprising:
a chamber;
a gas supply configured to supply a precursor gas, a first gas, and a second gas into the chamber;
a plasma generator configured to generate plasma from the first gas and the second gas; and
a controller configured to control the gas supply and the plasma generator,
wherein the controller is configured to perform a process including:
(a) controlling the gas supply to supply the precursor gas into the chamber, thereby adsorbing a precursor contained in the precursor gas on a side wall surface of a substrate; and
(b) controlling the gas supply and the plasma generator to generate plasma from the first gas and the second gas in the chamber, thereby generating a first chemical species that forms a film from the precursor on the side wall surface from the first gas, and generating a second chemical species that suppresses an increase in a thickness of the film from the second gas, and
wherein as (a) and (b) are alternately repeated, a radio-frequency power and an electrical bias to form the plasma are applied during (b), wherein there is no radio-frequency power and no electrical bias applied during (a).

* * * * *